(12) United States Patent
Moon et al.

(10) Patent No.: US 11,309,014 B2
(45) Date of Patent: Apr. 19, 2022

(54) MEMORY DEVICE TRANSMITTING SMALL SWING DATA SIGNAL AND OPERATION METHOD THEREOF

(71) Applicant: Samsung Electronics Co., Ltd., Suwon-si (KR)

(72) Inventors: Byongmo Moon, Seoul (KR); Sungoh Ahn, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/143,619

(22) Filed: Jan. 7, 2021

(65) Prior Publication Data

US 2021/0225423 A1 Jul. 22, 2021

(30) Foreign Application Priority Data

Jan. 21, 2020 (KR) .................. 10-2020-0008118
Sep. 1, 2020 (KR) .................. 10-2020-0110861

(51) Int. Cl.
| | | |
|---|---|---|
| *G11C 11/40* | (2006.01) | |
| *G11C 11/4074* | (2006.01) | |
| *H01L 25/18* | (2006.01) | |
| *H01L 23/00* | (2006.01) | |
| *G11C 11/4096* | (2006.01) | |
| *G06F 1/10* | (2006.01) | |
| *G06F 1/26* | (2006.01) | |
| *G11C 11/4093* | (2006.01) | |

(52) U.S. Cl.
CPC ............ *G11C 11/4074* (2013.01); *G06F 1/10* (2013.01); *G06F 1/263* (2013.01); *G11C 11/4093* (2013.01); *G11C 11/4096* (2013.01); *H01L 24/16* (2013.01); *H01L 25/18* (2013.01); *H01L 2224/16146* (2013.01)

(58) Field of Classification Search
None
See application file for complete search history.

(56) References Cited

U.S. PATENT DOCUMENTS

| | | | |
|---|---|---|---|
| 7,142,834 B2 * | 11/2006 | Miyagi | ............. H03K 5/1252 455/296 |
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |

(Continued)

FOREIGN PATENT DOCUMENTS

| | | |
|---|---|---|
| JP | 2016219948 A | 12/2016 |
| KR | 1020010004686 A | 1/2001 |
| KR | 1020020049200 A | 6/2002 |

*Primary Examiner* — Tan T. Nguyen
(74) *Attorney, Agent, or Firm* — Muir Patent Law, PLLC

(57) ABSTRACT

Disclosed is a memory device, which includes a buffer die that outputs a first power supply voltage to a first through-substrate via (e.g., through-silicon via (TSV)) and receives a small swing data signal from a second TSV generated based on the first power supply voltage, and a core die that is electrically connected to the buffer die through the first and second TSVs, includes a first cell capacitor electrically connected to the first TSV and configured to block a first noise introduced to the first power supply voltage received through the first TSV. The core die outputs the small swing data signal to the second TSV.

20 Claims, 11 Drawing Sheets

(56) References Cited

U.S. PATENT DOCUMENTS

| | | | |
|---|---|---|---|
| 8,917,119 B2* | 12/2014 | Cho | G11C 7/1057 |
| | | | 327/108 |
| 8,933,747 B2* | 1/2015 | Kang | G11C 11/4074 |
| | | | 327/565 |
| 8,937,490 B2 | 1/2015 | Moon et al. | |
| 9,692,394 B1 | 6/2017 | Agrawal et al. | |
| 9,825,631 B1 | 11/2017 | Cho et al. | |
| 9,947,378 B2 | 4/2018 | Lee et al. | |
| 10,250,261 B1 | 4/2019 | Byeon | |
| 10,361,699 B2 | 7/2019 | Lee et al. | |
| 10,490,553 B2 | 11/2019 | Yamazaki | |
| 10,529,413 B2 | 1/2020 | Atsumi et al. | |
| 2005/0117379 A1* | 6/2005 | Kang | G11C 5/14 |
| | | | 365/145 |
| 2011/0233648 A1 | 9/2011 | Seol et al. | |
| 2012/0008443 A1* | 1/2012 | Hebig | H03K 19/00346 |
| | | | 365/203 |
| 2016/0285453 A1 | 9/2016 | Thilenius et al. | |
| 2017/0154655 A1 | 6/2017 | Seo | |

* cited by examiner

MEMORY DEVICE TRANSMITTING SMALL SWING DATA SIGNAL AND OPERATION METHOD THEREOF

CROSS-REFERENCE TO RELATED APPLICATIONS

This application claims priority under 35 U.S.C. § 119 to Korean Patent Application Nos. 10-2020-0008118 filed on Jan. 21, 2020 and 10-2020-0110861 filed on Sep. 1, 2020, in the Korean Intellectual Property Office, the disclosure of each of which is incorporated by reference herein in its entirety.

BACKGROUND

Embodiments of the present disclosure disclosed herein relate to a memory device and an operation method thereof, and more particularly, relate to a memory device that is driven with a low power supply voltage and transmits a small swing data signal and an operation method thereof.

Semiconductor memory devices may store data or may output the stored data. Nowadays, to make the integration of a semiconductor memory device high and an operating speed faster, there is developed a technology for stacking memory dies of the semiconductor memory device three-dimensionally. The three-dimensionally stacked memory dies may be electrically connected by using a through-substrate via (e.g., a through-silicon via (TSV)). For example, the memory dies of the semiconductor memory device may be supplied with a power supply voltage through the TSV or may transmit or receive a data signal through the TSV.

Meanwhile, as circuits included in the semiconductor memory device are miniaturized and are highly integrated, the number of TSVs included in the semiconductor memory device may increase, and power consumption may increase due to an increase in the number of TSVs. Accordingly, there is needed a technique for reducing power consumption of a semiconductor device (e.g., the amount of power consumed by the TSV).

SUMMARY

Embodiments of the present disclosure provide a memory device that is driven with a low power supply voltage and is capable of reducing power consumption by transmitting a small swing data signal of a voltage lower than that of a general data signal, and an operation method thereof.

According to an example embodiment, a memory device includes a buffer die that outputs a first power supply voltage to a first through-substrate via (e.g., through-silicon via (TSV)) and receives a first small swing data signal from a second TSV generated based on the first power supply voltage, and a first core die that is electrically connected to the buffer die through the first and second TSVs, includes a first cell capacitor electrically connected to the first TSV and configured to block a first noise introduced to the first power supply voltage received through the first TSV. The first core die outputs the small swing data signal to the second TSV. A voltage of a high level of the first small swing data signal may be lower than the first power supply voltage.

According to an example embodiment, a memory device includes a buffer die that outputs a first power supply voltage to a first through-substrate via (e.g., through-silicon via (TSV)) and outputs a small swing data signal to a second TSV generated based on the first power supply voltage, and a core die that is electrically connected to the buffer die through the first and second TSVs, includes a first cell capacitor electrically connected to the first TSV and configured to block a first noise introduced to the first power supply voltage received through the first TSV. The core die receives the small swing data signal from the second TSV. A voltage of a high level of the small swing data signal may be lower than the first power supply voltage.

According to an example embodiment, an operation method of a memory device which includes a buffer die and a core die electrically connected to the buffer die through a through-substrate via (e.g., through-silicon via (TSV)) and a second TSV includes supplying a first power supply voltage from the buffer die to the core die through the first TSV, blocking or reducing a first noise introduced to the first power supply voltage by a first cell capacitor of the core die, the first cell capacitor electrically connected to the first TSV, generating, at the buffer die or the core die, a small swing data signal based on the first power supply voltage, and transmitting the small swing data signal through the second TSV.

BRIEF DESCRIPTION OF THE FIGURES

The above and other objects and features of the present disclosure will become apparent by describing in detail example embodiments thereof with reference to the accompanying drawings.

DETAILED DESCRIPTION

Figure 1:
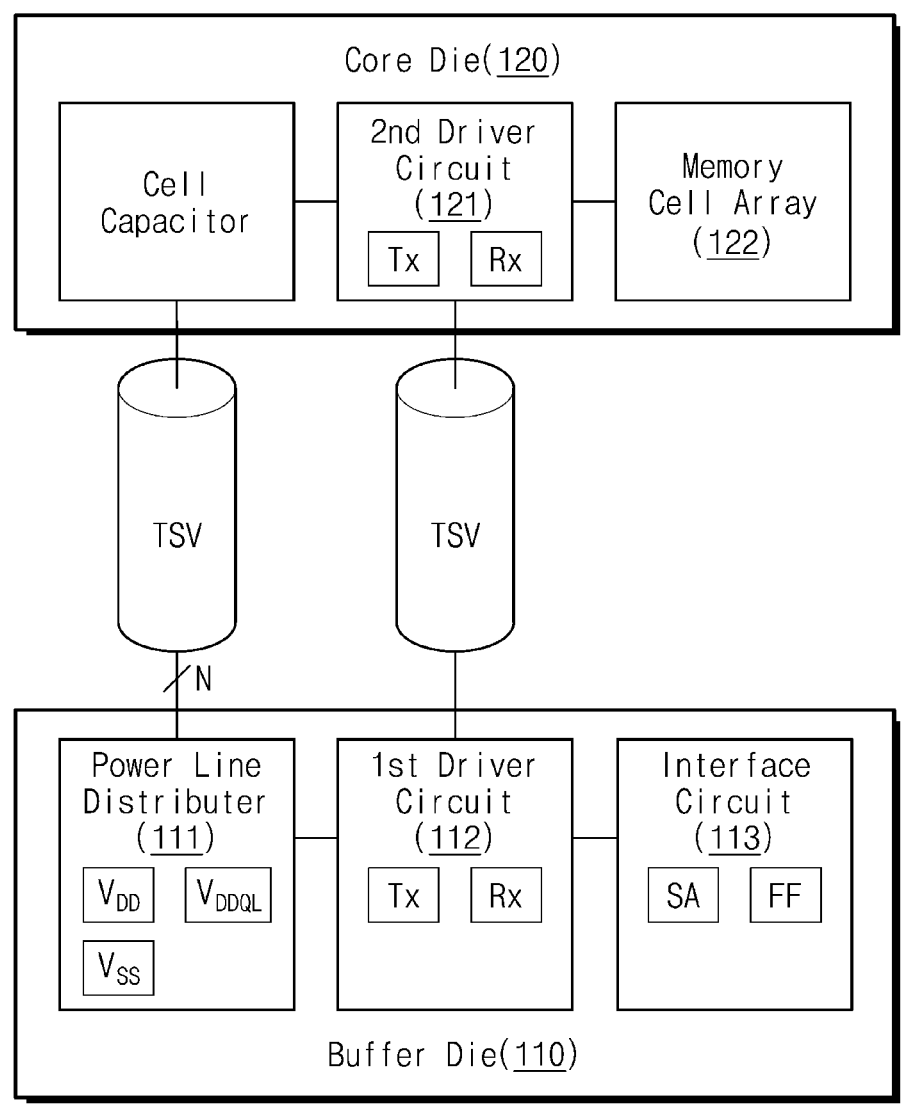
FIG. 1 is a block diagram illustrating a memory device according to an embodiment of the present disclosure.

Below, embodiments of the present disclosure are described in detail and clearly to such an extent that an ordinary one in the art easily implements the present disclosure. Below, for convenience of description, similar components are expressed by using the same or similar reference numerals.

In the following drawings or in the detailed description, modules may be connected with any other components except for components illustrated in a drawing or described in the detailed description. Modules or components may be connected directly or indirectly. Modules or components may be connected through communication or may be physically connected.

In the following drawings and the detailed description, the terms "first direction DR1", "second direction DR2", and "third direction DR3" will be used. The first direction DR1 may be a direction parallel to a buffer die and a core die included in a memory device. The second direction DR2 may be a direction perpendicular to the first direction DR1. The third direction DR3 may be a direction perpendicular to a plane defined by the first direction DR1 and the second direction DR2. In this case, the third direction DR3 may be a direction parallel to a through-substrate via (e.g., a through-silicon via (TSV)) penetrating the memory device. Note, however, that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal or directional number (e.g., "first" in a particular claim) may be described elsewhere with a different ordinal or directional number (e.g., "second" in the specification or another claim).

FIG. 1 is a block diagram illustrating a memory device 100 according to an embodiment of the present disclosure. Referring to FIG. 1, the memory device 100 may include a buffer die 110 and a core die 120. In example embodiments, the buffer die 110 and the core die 120 may be provided from different wafers. The memory device 100 may be a device that stores data or outputs the stored data. The memory device 100 may be a high bandwidth memory (HBM) of a three-dimensional structure. For example, the memory device 100 may be a dynamic random access memory (DRAM) that is used in electronic devices such as a computer, a laptop computer, and a smartphone.

The buffer die 110 may include a power line distributer 111, a first driver circuit 112, and an interface circuit 113. The power line distributer 111 may be a circuit that transmits a power supply voltage $V_{DD}$, a power supply voltage $V_{DDQL}$, and a power supply voltage $V_{SS}$. The power supply voltages $V_{DD}$, $V_{DDQL}$, and $V_{SS}$ may be voltages that are used to drive the memory device 100. For example, the power supply voltages $V_{DD}$, $V_{DDQL}$, and $V_{SS}$ may be used to drive the first driver circuit 112, the interface circuit 113, and a second driver circuit 121. In example embodiments, the power supply voltages $V_{DD}$, $V_{DDQL}$, and $V_{SS}$ may be provided from an external power supply device (not shown).

The power supply voltages $V_{DD}$, $V_{DDQL}$, and $V_{SS}$ indicating a voltage of a specific node may be used to designate the specific node itself. For example, each of the power supply voltages $V_{DD}$, $V_{DDQL}$, and $V_{SS}$ may designate an intermediate node or may designate a voltage of the intermediate node. However, the present disclosure is not limited thereto. For example, the power supply voltages $V_{DD}$, $V_{DDQL}$, and $V_{SS}$ should be interpreted depending on the context of embodiments.

In an example embodiment, the power supply voltage $V_{DD}$ may be a high voltage that is used to drive the memory device 100. The power supply voltage $V_{DDQL}$ may be a voltage lower than the power supply voltage $V_{DD}$. The power supply voltage $V_{SS}$ may be a voltage lower than the power supply voltage $V_{DDQL}$. For example, the power supply voltage $V_{DD}$ may be approximately 1.1 V. The power supply voltage $V_{DDQL}$ may be approximately 0.4 V. The power supply voltage $V_{SS}$ may be approximately 0 V.

In an example embodiment, the memory device 100 may use the power supply voltage $V_{DD}$ and the power supply voltage $V_{DDQL}$ together, instead of using only the power supply voltage $V_{DD}$. As the power supply voltage $V_{DD}$ to be transmitted through at least one TSV is replaced with the power supply voltage $V_{DDQL}$ being relatively low, power consumption of the memory device 100 (e.g., power consumption at a corresponding TSV) may decrease.

An example is illustrated as the power line distributer 111 includes three kinds of power supply voltages $V_{DD}$, $V_{DDQL}$, and $V_{SS}$, but the present disclosure is not limited thereto. For example, the power line distributer 111 may further include any other power supply voltages necessary for an operation of the memory device 100, or a power supply voltage(s) unnecessary from among the power supply voltages $V_{DD}$, $V_{DDQL}$, and $V_{SS}$ may be omitted or changed depending on the design or process of the memory device 100. The power line distributer 111 may output the power supply voltages $V_{DD}$, $V_{DDQL}$, and $V_{SS}$ through corresponding TSVs of N TSVs, respectively. The number N of TSVs connected with the power line distributer 111 may increase or decrease depending on the design or process of the memory device 100.

The TSV may be an electrode that physically penetrates at least one of the buffer die 110 and the core die 120 and transmits a power supply voltage or an electrical signal such as a data signal. For better understanding, an example is illustrated in FIG. 1 as TSVs connect the buffer die 110 and the core die 120. However, the TSVs may physically penetrate the buffer die 110 or the core die 120, and micro-bumps connected to the TSVs may be interposed between the buffer die 110 and the core die 120. A micro-bump may be an element bonding different dies (e.g., the buffer die 110 and the core die 120). This will be more fully described with reference to FIGS. 2A and 2B.

The first driver circuit 112 may include a transmitter Tx and a receiver Rx. The transmitter Tx of the first driver circuit 112 may be driven based on at least one of the power supply voltages $V_{DD}$, $V_{DDQL}$, and $V_{SS}$ and may output a data signal received from the interface circuit 113 to the second driver circuit 121 through one or more corresponding TSVs. The receiver Rx of the first driver circuit 112 may be driven based on at least one of the power supply voltages $V_{DD}$, $V_{DDQL}$, and $V_{SS}$, may receive a data signal received from the second driver circuit 121 through the one or more corresponding TSVs, and may output a data signal to the interface circuit 113.

The interface circuit 113 may be connected to an electronic device (e.g., a memory controller) different from the memory device 100. The interface circuit 113 may include a sense amplifier SA and a flip-flop FF. The sense amplifier SA may be a circuit that amplifies a small swing data signal. The flip-flop FF may be a circuit that holds or stores data corresponding to the amplified small swing data signal. The interface circuit 113 may transmit a data signal received from the first driver circuit 112 electrically connected therewith to the different electronic device. Also, the interface circuit 113 may output a data signal received from the different electronic device to the first driver circuit 112.

The core die 120 may include a cell capacitor, the second driver circuit 121, and a memory cell array 122. The memory cell array 122 may include a plurality of memory cells. Each memory cell (e.g., DRAM cell) of the memory cell array 122 may include a transistor and a capacitor connected to the transistor. The capacitor of the memory cell may store data. The cell capacitor disclosed herein may be disposed separated from capacitors of the plurality of memory cells, and be formed by the same manufacturing process as that of the capacitors of memory cells. In this case, the cell capacitor and the capacitors of memory cells may be disposed at the same height. For example, the cell capacitor and the capacitors of memory cells may be simultaneously formed. The capacitance of a cell capacitor may be greater than capacitance of a capacitor of one memory cell. The cell capacitor may be a decoupling capacitor that is physically formed in the core die 120 and may block or reduce a noise. A noise may be unintended energy, which is introduced from an adjacent circuit, such as a leakage current. For example, a noise may be AC components of the power supply voltages $V_{DD}$, $V_{DDQL}$, and $V_{SS}$ or a large current instantly introduced.

In an example embodiment, the cell capacitor may be placed between a path through which the power supply voltage $V_{DD}$ received from the buffer die 110 is transmitted to the core die 120 and a path through which another voltage is transmitted, thus reducing an influence of a noise. For example, the cell capacitor may reduce an influence of an AC component of the power supply voltage $V_{DD}$ on the power supply voltage $V_{DDQL}$. The cell capacitor may be disposed in an empty region of the core die 120 such that a space efficiency of the memory device 100 is maximized. The placement of the cell capacitor will be more fully described with reference to FIG. 7.

The second driver circuit 121 may include a transmitter Tx and a receiver Rx. The transmitter Tx of the second driver circuit 121 may be driven based on at least one of the power supply voltages $V_{DD}$, $V_{DDQL}$, and $V_{SS}$ and may output a data signal received from the memory cell array 122 to the first driver circuit 112 through one or more corresponding TSVs. The receiver Rx of the second driver circuit 121 may be driven based on at least one of the power supply voltages $V_{DD}$, $V_{DDQL}$, and $V_{SS}$, may receive a data signal received from the first driver circuit 112 through one or more corresponding TSVs, and may output a data signal to the memory cell array 122.

For example, the transmitter Tx of the second driver circuit 121 may be similar to the transmitter Tx of the first driver circuit 112 in function. The receiver Rx of the second driver circuit 121 may be similar to the receiver Rx of the first driver circuit 112 in function. The transmitter Tx will be more fully described with reference to FIGS. 3 and 4. The receiver Rx will be more fully described with reference to FIG. 5.

In an example embodiment, a data signal that is transmitted between the first driver circuit 112 and the second driver circuit 121 through the TSV may be a small swing data signal. A voltage of the small swing data signal (hereinafter, the voltage of a data signal may mean a voltage range between a high level and a low level of the data signal) may be lower than that of a general data signal. For example, a voltage of the general data signal may range from the power supply voltage $V_{DD}$ to the power supply voltage $V_{SS}$. A voltage of the small swing data signal may range from the power supply voltage $V_{DDQL}$ and the power supply voltage $V_{SS}$. The power supply voltage $V_{DDQL}$ may be a voltage lower than the power supply voltage $V_{DD}$. For example, as a small swing data signal is transmitted between the buffer die 110 and the core die 120, power consumption of the memory device 100 (e.g., the amount of power consumed at a corresponding TSV) may decrease.

In an example embodiment, as the cell capacitor of the core die 120 blocks or reduces a noise to be introduced to the power supply voltages $V_{DD}$, $V_{DDQL}$, and $V_{SS}$, the reliability of the small swing data signal between the first driver circuit 112 and the second driver circuit 121 may be improved. For example, because a voltage of the small swing data signal is low, the small swing data signal may be vulnerable to a noise such as a leakage current. As the cell capacitor of the core die 120 blocks or reduces a noise, distortion or deformation of the small swing data signal may be minimized.

The memory cell array 122 may include a plurality of memory cells each configured to store data and to output the stored data. The memory cell array 122 may be electrically connected to the second driver circuit 121. The memory cell array 122 may output data stored therein to the transmitter Tx of the second driver circuit 121. The memory cell array 122 may store a data signal from the receiver Rx of the second driver circuit 121.

For better understanding, an example is illustrated as the buffer die 110 is connected to one core die 120, but the present disclosure is not limited thereto. For example, the memory device 100 may further include at least one additional core die similar to the core die 120 in structure. The memory device 100 including a plurality of core dies will be more fully described with reference to FIGS. 2A, 2B, and 6.

As described above, according to an embodiment of the present disclosure, the memory device 100 in which power consumption is reduced may be provided by using the power supply voltage $V_{DDQL}$ lower than the power supply voltage $V_{DD}$ and using a small swing data signal of a low voltage. Also, the memory device 100 in which the reliability of the small swing data signal is improved may be provided by blocking or reducing a noise in the core die 120 through the cell capacitor.

Figure 2A:
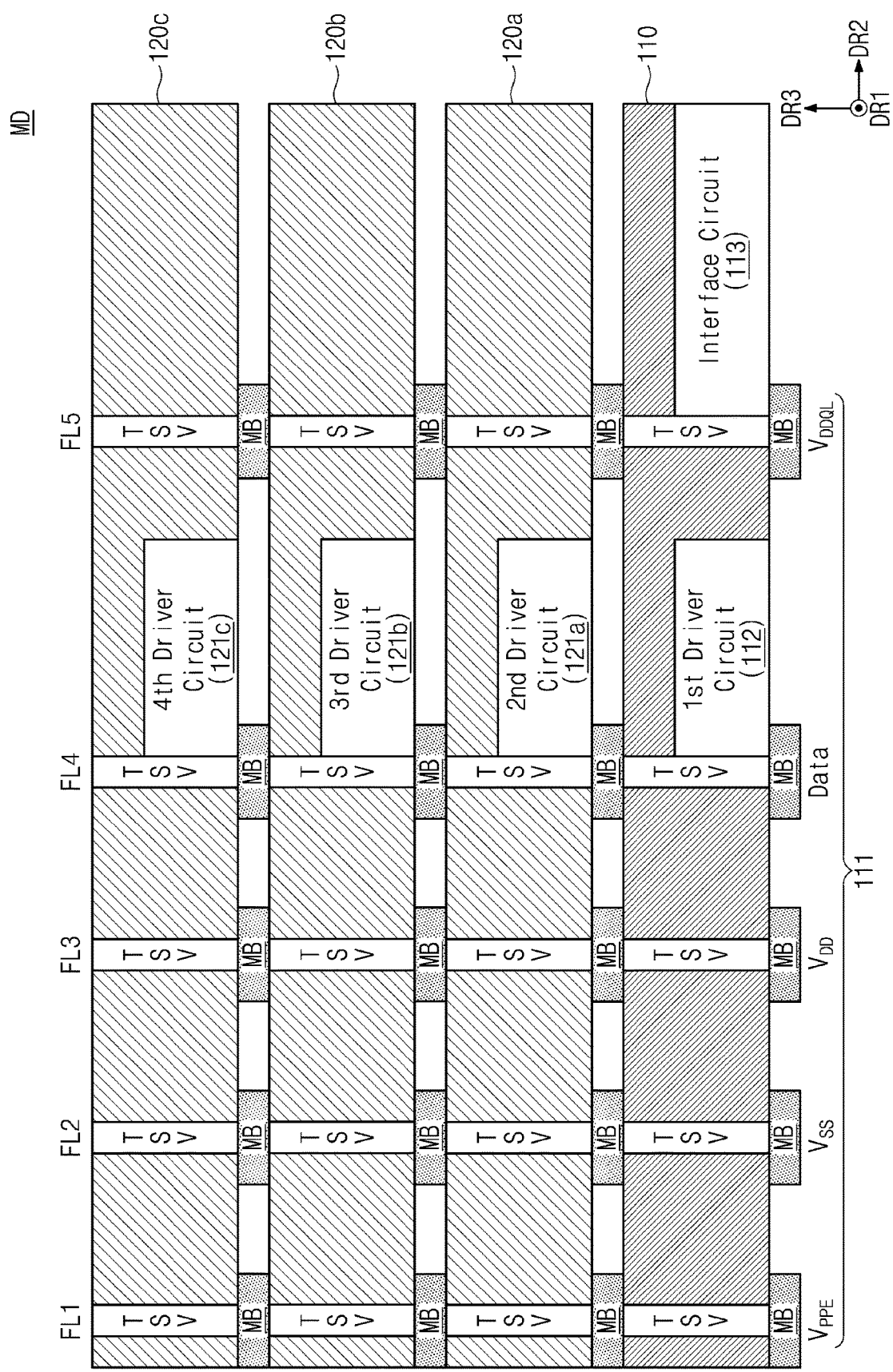
FIG. 2A is a cross-sectional view of a general memory device.

FIG. 2A is a cross-sectional view of a general memory device MD. Referring to FIG. 2A, the memory device MD may include the buffer die 110 and first to third core dies 120a to 120c sequentially stacked in the third direction DR3. An example is illustrated as the memory device MD includes three core dies 120a to 120c, but the present disclosure is not limited thereto. In example embodiments, the number of core dies included in the memory device MD may increase or decrease.

The buffer die 110 may include the power line distributer 111, the first driver circuit 112, and the interface circuit 113. The power line distributer 111 may include micro-bumps MB of receiving a power supply voltage $V_{PPE}$, the power supply voltage $V_{SS}$, the power supply voltage $V_{DD}$, a data signal, and the power supply voltage $V_{DDQL}$. The power supply voltage $V_{PPE}$ may be a very high voltage that is used to drive the memory device MD. The power supply voltage $V_{PPE}$ may be a pumping voltage. The power supply voltage $V_{DD}$ may be a voltage lower than the power supply voltage $V_{PPE}$. The power supply voltage $V_{DDQL}$ may be a voltage lower than the power supply voltage $V_{DD}$. The power supply voltage $V_{SS}$ may be a voltage lower than the power supply voltage $V_{DDQL}$. The data signal may include data to be stored in the memory device MD or data read from the memory device MD.

The power line distributer 111 may be connected to the first to third core dies 120a to 120c through corresponding feed lines FL. A feed line FL may include at least one micro-bump and at least one TSV that are continuously connected. A feed line FL may be a conductive line through which a power supply voltage is supplied or a data signal is transmitted.

For example, the power line distributer 111 may supply the power supply voltage $V_{PPE}$ to the first to third core dies 120a to 120c through a first feed line FL1. The power line distributer 111 may supply the power supply voltage $V_{SS}$ to the first to third core dies 120a to 120c through a second feed line FL2. The power line distributer 111 may supply the power supply voltage $V_{DD}$ to the first to third core dies 120a to 120c through a third feed line FL3. The power line distributer 111 may supply the power supply voltage $V_{DDQL}$ to the first to third core dies 120a to 120c through a fifth feed line FL5.

For example, the power line distributer 111 may output a data signal to the first to third core dies 120a to 120c through a fourth feed line FL4 or may receive a data signal from the first to third core dies 120a to 120c through the fourth feed line FL4.

The first driver circuit 112 and the interface circuit 113 may be circuits formed in the buffer die 110. The first driver circuit 112 and the interface circuit 113 may be electrically connected to the power line distributer 111.

The first core die 120a may include a second driver circuit 121a. The second driver circuit 121a may be the second driver circuit 121 of FIG. 1. The second core die 120b may include a third driver circuit 121b. The third core die 120c may include a fourth driver circuit 121c. The second to fourth driver circuits 121a to 121c may be electrically connected to the power line distributer 111 through the first to fifth feed lines FL1 to FL5.

Meanwhile, as the memory device MD is miniaturized and is highly integrated, the physical size of the buffer die 110 and the first to third core dies 120a to 120c may become smaller. Also, the power supply voltage $V_{DDQL}$ being a low voltage may be used to improve a power efficiency of the memory device MD. Unlike the memory device 100 of FIG. 1 including a noise blocking or reducing element such as a cell capacitor, the highly-integrated memory device MD that is driven with a low power may be vulnerable to a noise.

Figure 2B:
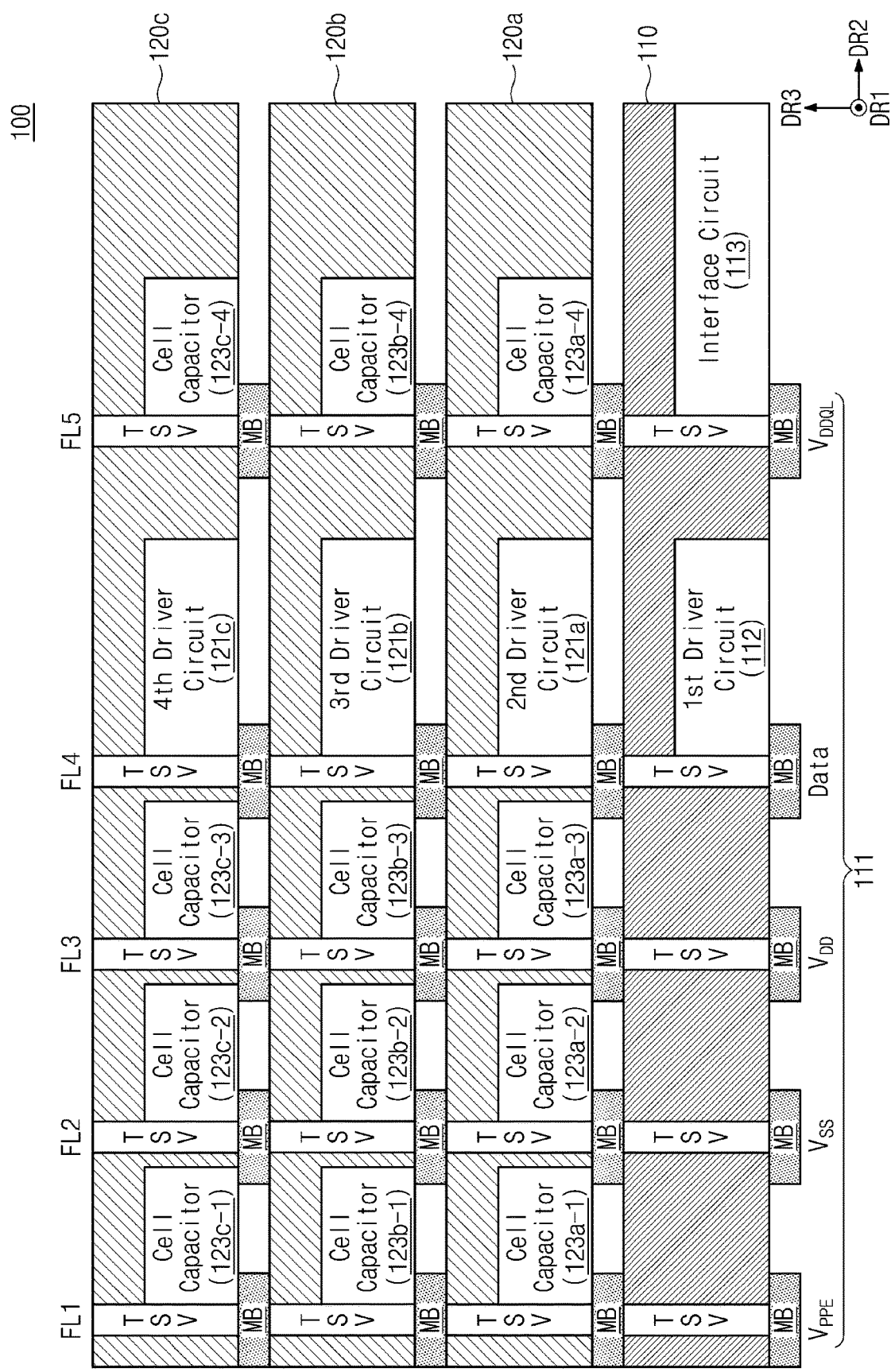
FIG. 2B is a cross-sectional view of a memory device including cell capacitors, according to an embodiment of the present disclosure.

FIG. 2B is a cross-sectional view of the memory device 100 including cell capacitors, according to an embodiment of the present disclosure. Referring to FIG. 2B, the memory device 100 may include the buffer die 110 and the first to third core dies 120a to 120c. The buffer die 110 may include the power line distributer 111, the first driver circuit 112, and the interface circuit 113. Each of the first to third core dies 120a to 120c may include a driver circuit (e.g., 121a, 121b, or 121c) and a plurality of cell capacitors. The buffer die 110 and the first to third core dies 120a to 120c may be connected through the first to fifth feed lines FL1 to FL5. In example embodiments, the buffer die 110 and the first to third core dies 120a to 120c may be from different wafers. For example, the buffer die may be from a first wafer and the first to third core dies 120a to 120c may be from a second wafer different from the first wafer.

The power line distributer 111, the first driver circuit 112, the interface circuit 113, the second to fourth driver circuits 121a to 121c, and the first to fifth feed lines FL1 to FL5 are similar to the power line distributer 111, the first driver circuit 112, the interface circuit 113, the second to fourth driver circuits 121a to 121c, and the first to fifth feed lines FL1 to FL5 of FIG. 2A, and thus, additional description will be omitted to avoid redundancy.

According to an embodiment of the present disclosure, each of the first to third core dies 120a to 120c may include the plurality of cell capacitors that are respectively disposed adjacent to the first to fifth feed lines FL1 to FL5. For example, a cell capacitor may be disposed adjacent in the first direction DR1 or the second direction DR2 with respect to the TSV penetrating a core die. The cell capacitor may be formed in the core die. The cell capacitor may be a decoupling capacitor blocking or reducing a noise introduced from an adjacent feed line.

For example, cell capacitors 123a-1, 123b-1, and 123c-1 may block or reduce a noise that is introduced to the first feed line FL1 through which the power supply voltage $V_{PPE}$ is supplied from the second feed line FL2 through which the power supply voltage $V_{SS}$ is supplied. Cell capacitors 123a-2, 123b-2, and 123c-2 may block or reduce a noise that is introduced to the second feed line FL2 through which the power supply voltage $V_{SS}$ is supplied. Cell capacitors 123a-3, 123b-3, and 123c-3 may block or reduce a noise that is introduced to the third feed line FL3 through which the power supply voltage $V_{DD}$ is supplied. Cell capacitors 123a-4, 123b-4, and 123c-4 may block or reduce a noise that is introduced to the fourth feed line FL4 through which the power supply voltage $V_{DDQL}$ is supplied.

In an example embodiment, the cell capacitors may be disposed in an empty region of the core die. For example, the cell capacitors 123a-1 to 123a-4 in the first core die 120a may be placed in a space where the second driver circuit 121a is not disposed. Because the cell capacitors 123a-1 to 123a-4 are disposed in the empty space of the first core die 120a, the physical size of the first core die 120a of the memory device 100 may not increase. For example, the cell capacitors 123b-1 to 123b-4 in the second core die 120b may be placed in a space where the third driver circuit 121b is not disposed. Because the cell capacitors 123b-1 to 123b-4 are disposed in the empty space of the second core die 120b, the physical size of the second core die 120b of the memory device 100 may not increase. For example, the cell capacitors 123c-1 to 123c-4 in the third core die 120c may be placed in a space where the fourth driver circuit 121c is not disposed. Because the cell capacitors 123c-1 to 123c-4 are disposed in the empty space of the third core die 120c, the physical size of the third core die 120c of the memory device 100 may not increase. In example embodiments, the cell capacitors 123a-2, 123b-2, and 123c-2 may be omitted. The empty region where the cell capacitor is disposed will be more fully described with reference to FIG. 7.

Figure 3:
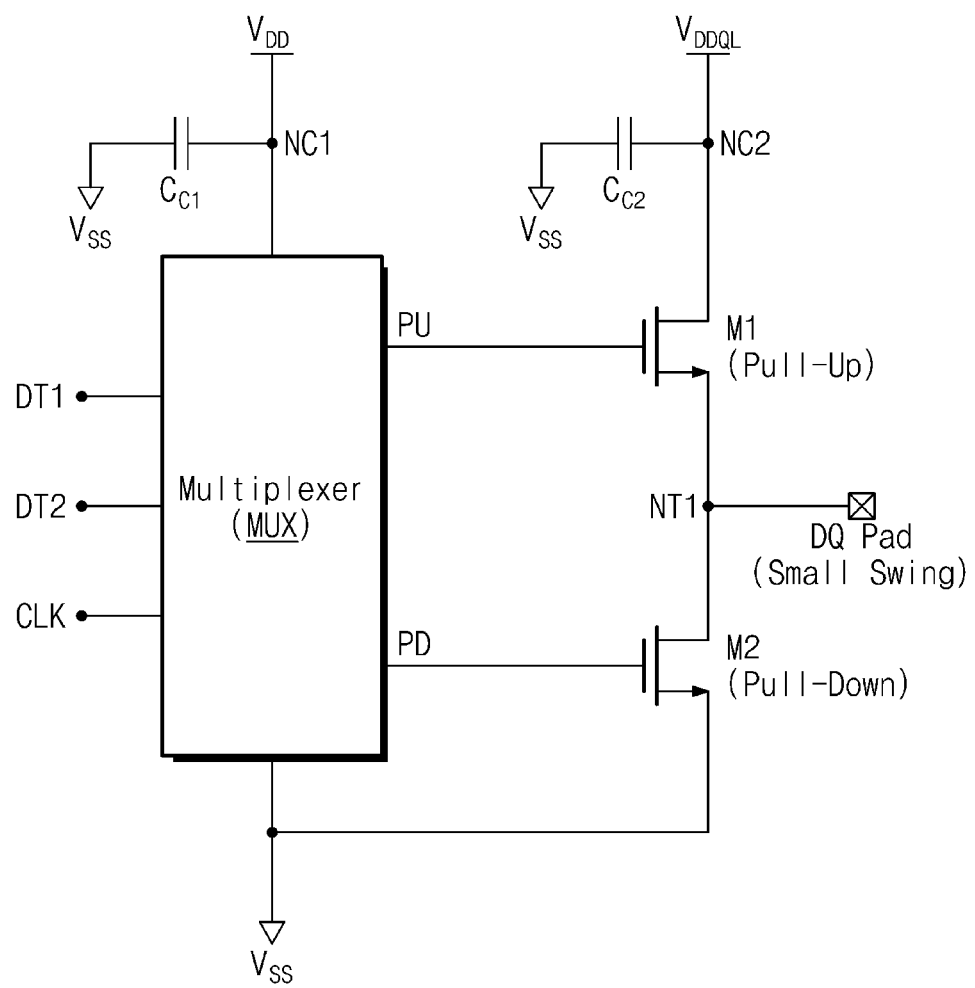
FIG. 3 is a circuit diagram illustrating a transmitter of FIG. 1 in detail according to example embodiments.

FIG. 3 is a circuit diagram illustrating the transmitter Tx of FIG. 1 in detail according to example embodiments. Referring to FIG. 3, the transmitter Tx may be driven based on the power supply voltages $V_{DD}$, $V_{DDQL}$, and $V_{SS}$ and may generate a small swing data signal based on a first data signal DT1, a second data signal DT2, and a clock signal CLK. The transmitter Tx of FIG. 3 may be the transmitter Tx of the first driver circuit 112 of FIG. 1 or may be the transmitter Tx of the second driver circuit 121 of FIG. 1.

The transmitter Tx may include a multiplexer MUX, a first transistor M1, and a second transistor M2. The multiplexer MUX may be driven based on the power supply voltages $V_{DD}$ and $V_{SS}$. A first capacitor node NC1 of supplying the power supply voltage $V_{DD}$ to the multiplexer MUX may be connected to a first cell capacitor $C_{C1}$. The first cell capacitor $C_{C1}$ may block or reduce a noise introduced to the power supply voltage $V_{DD}$. The first cell capacitor $C_{C1}$ may be the cell capacitor which is simultaneously formed with capacitors of memory cells if the transmitter Tx of FIG. 3 is included in the second driver circuit 121 of FIG. 1, and the first cell capacitor $C_{C1}$ may be a typical capacitor which is formed in as the form of a metal-oxide-semiconductor (MOS) capacitor if the transmitter Tx of FIG. 3 is included in the first driver circuit 112 of FIG. 1.

The multiplexer MUX may receive the first data signal DT1, the second data signal DT2, and the clock signal CLK. the first data signal DT1 may be a signal including logical values corresponding to information that the transmitter Tx will transmit. The second data signal DT2 may be an inverted version of the first data signal DT1. The clock signal CLK may be a signal in which a high logical state and a low logical state are periodically repeated. The clock signal CLK may be used to control a synchronization timing of the multiplexer MUX.

The multiplexer MUX may generate a pull-up signal PU and a pull-down signal PD based on the first data signal DT1, the second data signal DT2, and the clock signal CLK. A logical value of the pull-up signal PU may correspond to a logical value of the first data signal DT1. A logical value of the pull-down signal PD may correspond to a logical value of the second data signal DT2.

The first transistor M1 may be connected between a second capacitor node NC2 and a first transmission node NT1 and may operate in response to the pull-up signal PU. The second capacitor node NC2 may receive the power supply voltage $V_{DDQL}$. The second capacitor node NC2 may be connected to a second cell capacitor $C_{C2}$. The second cell capacitor $C_{C2}$ may block or reduce a noise introduced to the power supply voltage $V_{DDQL}$. The second cell capacitor $C_{C2}$ may be the cell capacitor which is simultaneously formed with capacitors of memory cells if the transmitter Tx of FIG. 3 is included in the second driver circuit 121 of FIG. 1, and the second cell capacitor $C_{C2}$ may be a typical capacitor which is formed in such as a MOS capacitor if the transmitter Tx of FIG. 3 is included in the first driver circuit 112 of FIG. 1. The first transmission node NT1 may be connected to a DQ pad. A small swing data signal may be generated at the DQ pad.

In an example embodiment, when the first transistor M1 is turned on in response to the pull-up signal PU, the power supply voltage $V_{DDQL}$ may be supplied to the first transmission node NT1. In this case, a voltage corresponding to a small swing data signal generated at the DQ pad may increase. That is, the first transistor M1 may be a pull-up transistor. In this case, the second transistor M2 may be turned off.

The second transistor M2 may be connected between the first transmission node NT1 and the ground node $V_{SS}$ and may operate in response to the pull-down signal PD. The first transmission node NT1 may be connected to the DQ pad.

In an example embodiment, when the second transistor M2 is turned on in response to the pull-down signal PD, the power supply voltage $V_{SS}$ may be supplied to the first transmission node NT1. In this case, a voltage corresponding to a small swing data signal generated at the DQ pad may decrease. That is, the second transistor M2 may be a pull-down transistor. In this case, the first transistor M1 may be turned off.

A small swing data signal may be generated at the DQ pad. A voltage corresponding to a small swing data signal may be determined based on an operation of the first transistor M1 and an operation of the second transistor M2. The voltage of the small swing data signal may range from the power supply voltage $V_{DDQL}$ and the power supply voltage $V_{SS}$. For example, the small swing data signal may have a voltage ranging from 0 V to 0.4 V (e.g., a low level=0V and a high level=0.4V).

In an example embodiment, the first transistor M1 may be an NMOS transistor, and the second transistor M2 may be an NMOS transistor. For example, a general transmitter of a CMOS structure, which is driven based on the power supply voltages $V_{DD}$ and $V_{SS}$, may use a PMOS transistor as a pull-up transistor and may use an NMOS transistor as a pull-down transistor. In contrast, the transmitter Tx according to an embodiment of the present disclosure may form a voltage of the DQ pad with the power supply voltage $V_{DDQL}$ lower than the power supply voltage $V_{DD}$ and may include a pull-up transistor and a pull-down transistor each implemented with an NMOS transistor for low-voltage driving.

In example embodiments, each of the first cell capacitor $C_{C1}$ and the second cell capacitor $C_{C2}$ may be the cell capacitor which is simultaneously formed with capacitors of memory cells if the transmitter Tx of FIG. 3 is included in the second driver circuit 121 of FIG. 1, and each of the first cell capacitor $C_{C1}$ and the second cell capacitor $C_{C2}$ may be a typical capacitor which is formed in as the form of a MOS capacitor if the transmitter Tx of FIG. 3 is included in the first driver circuit 112 of FIG. 1.

Figure 4:
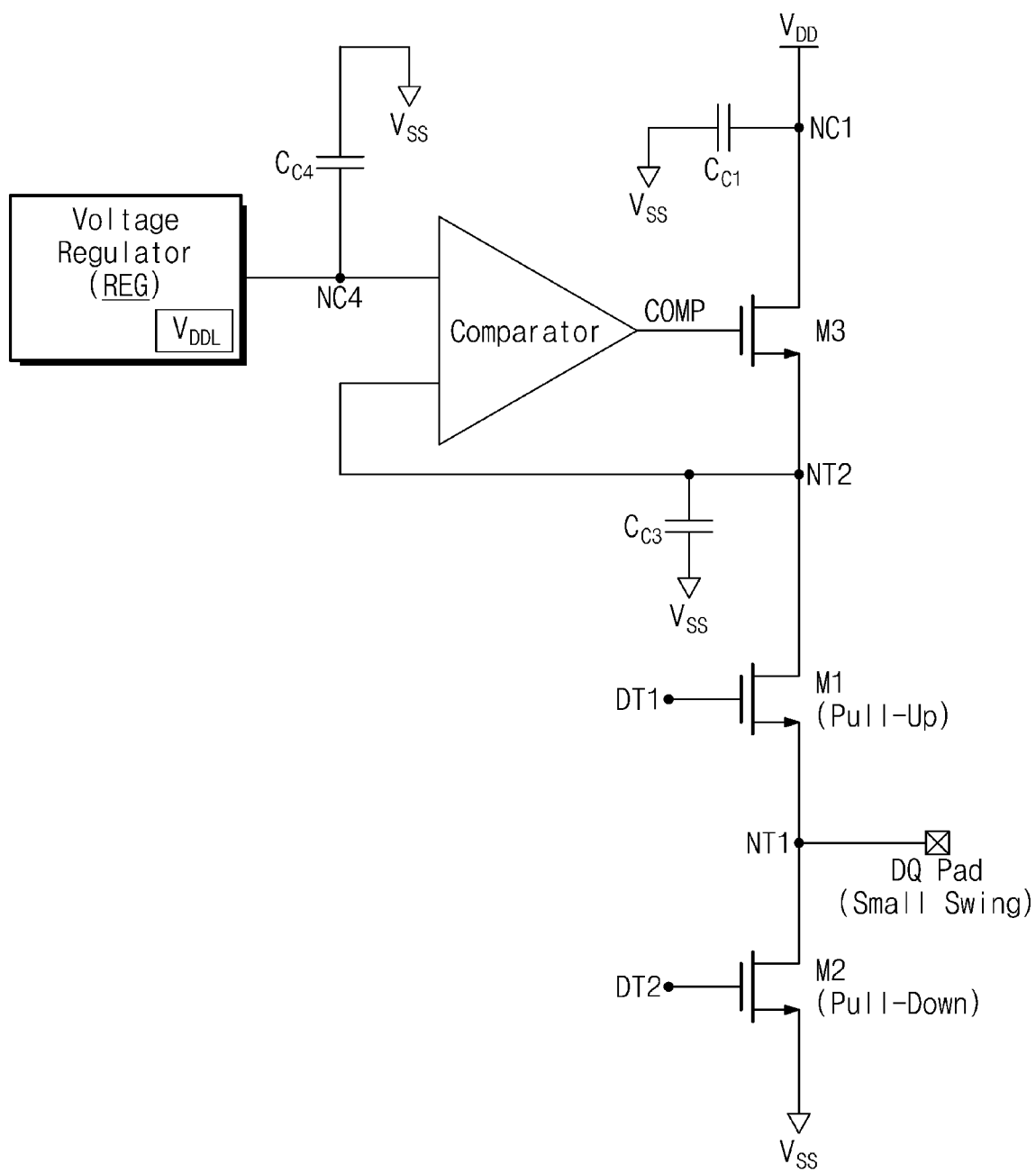
FIG. 4 is a circuit diagram illustrating a transmitter of FIG. 1 in detail according to example embodiments.

FIG. 4 is a circuit diagram illustrating the transmitter Tx of FIG. 1 in detail according to example embodiments. The transmitter Tx implemented according to another embodiment is illustrated in FIG. 4. Referring to FIG. 4, the transmitter Tx may be driven based on the power supply voltages $V_{DD}$ and $V_{SS}$ and may generate a small swing data signal based on the first data signal DT1, the second data signal DT2, and a power supply voltage $V_{DDL}$ generated at a voltage regulator REG. The transmitter Tx of FIG. 4 may be the transmitter Tx of the first driver circuit 112 of FIG. 1 or may be the transmitter Tx of the second driver circuit 121 of FIG. 1.

Unlike the transmitter Tx of FIG. 3, the transmitter Tx of FIG. 4 may operate based on the power supply voltage $V_{DDL}$ generated at the voltage regulator REG. The voltage regulator REG may be a circuit that generates the power supply voltage $V_{DDL}$ adjustable within a given range. A voltage value of the power supply voltage $V_{DDL}$ may be greater than that of the power supply voltage $V_{SS}$ and may be adjusted within a range smaller than that of the power supply voltage $V_{DD}$. For example, the power supply voltage $V_{DDL}$ may range from 0.4 V to 0.7 V. A voltage value of the power supply voltage $V_{DDL}$ may be changed within a range from 0.4 V to 0.7 V depending on an operation of the voltage regulator REG.

In an example embodiment, the memory device 100 of FIG. 1 may include the voltage regulator REG that provides the power supply voltage $V_{DDL}$ to the power line distributer 111 of the buffer die 110. For example, the voltage regulator REG may be included in the buffer die 110 and the core die 120, respectively. The power supply voltage $V_{DDL}$ may be provided from the power line distributer 111 to the transmitter Tx of the core die 120 through the corresponding TSV. The core die 120 may include a cell capacitor (e.g., a fourth cell capacitor $C_{C4}$) blocking or reducing a noise introduced to the power supply voltage $V_{DDL}$.

The transmitter Tx may include a comparator, the first transistor M1, the second transistor M2, and a third transistor M3. The comparator may compare a voltage of a fourth capacitor node NC4 and a voltage of a second transmission node NT2 and may generate a comparison signal COMP. The comparison signal COMP may be a signal controlling the third transistor M3 so as to be turned on when the voltage of the fourth capacitor node NC4 is greater than the voltage of the second transmission node NT2.

The core die 120 may include a cell capacitor (e.g., a third cell capacitor $C_{C3}$) blocking or reducing a noise introduced to the second transmission node NT2. For example, the second transmission node NT2 may be connected to a third cell capacitor $C_{C3}$. The third cell capacitor $C_{C3}$ may be the cell capacitor which is simultaneously formed with capacitors of memory cells if the transmitter Tx of FIG. 4 is included in the second driver circuit 121 of FIG. 1, and the third cell capacitor $C_{C3}$ may be a typical capacitor which is formed in as the form of a MOS capacitor if the transmitter Tx of FIG. 4 is included in the first driver circuit 112 of FIG. 1.

The fourth capacitor node NC4 may receive the power supply voltage $V_{DDL}$ from the voltage regulator REG. The fourth capacitor node NC4 may be connected to the fourth cell capacitor $C_{C4}$. The fourth cell capacitor $C_{C4}$ may block or reduce a noise introduced to the power supply voltage $V_{DDL}$. The fourth cell capacitor $C_{C4}$ may be the cell capacitor which is simultaneously formed with capacitors of memory cells if the transmitter Tx of FIG. 4 is included in the second driver circuit 121 of FIG. 1, and the fourth cell capacitor $C_{C4}$ may be a typical capacitor which is formed in as the form of a MOS capacitor if the transmitter Tx of FIG. 4 is included in the first driver circuit 112 of FIG. 1.

The third transistor M3 may be connected between the first capacitor node NC1 and the second transmission node NT2 and may operate in response to the comparison signal COMP. The first capacitor node NC1 may receive the power supply voltage $V_{DD}$. The first capacitor node NC1 may be connected to the first cell capacitor $C_{C1}$. The first cell capacitor $C_{C1}$ may block or reduce a noise introduced to the power supply voltage $V_{DD}$.

The first transistor M1 may be connected between the second transmission node NT2 and the first transmission node NT1 and may operate in response to the first data signal DT1. The first data signal DT1 may be a signal including logical values corresponding to information that the transmitter Tx will transmit. The first transmission node NT1 may be connected to the DQ pad. A small swing data signal may be generated at the DQ pad. The first transistor M1 may be a pull-up transistor.

The second transistor M2 may be connected between the first transmission node NT1 and the ground node $V_{SS}$ and may operate in response to the second data signal DT2. The second data signal DT2 may be an inverted version of the first data signal DT1. The second transistor M2 may be a pull-down transistor.

A small swing data signal may be generated at the DQ pad. A voltage corresponding to a small swing data signal may be determined based on operations of the first to third transistors M1 to M3. The voltage of the small swing data signal may range from the power supply voltage $V_{DDL}$ and the power supply voltage $V_{SS}$. For example, the power supply voltage $V_{SS}$ may be 0 V. The power supply voltage $V_{DDL}$ may range from 0.4 V to 0.7 V. A value of the power supply voltage $V_{DDL}$ may be changed by the voltage regulator REG.

In an example embodiment, the first transistor M1 may be an NMOS transistor, the second transistor M2 may be an NMOS transistor, and the third transistor M3 may be an NMOS transistor. The transmitter Tx may generate a small swing data signal by using NMOS transistors appropriate of low-voltage driving.

Figure 5:
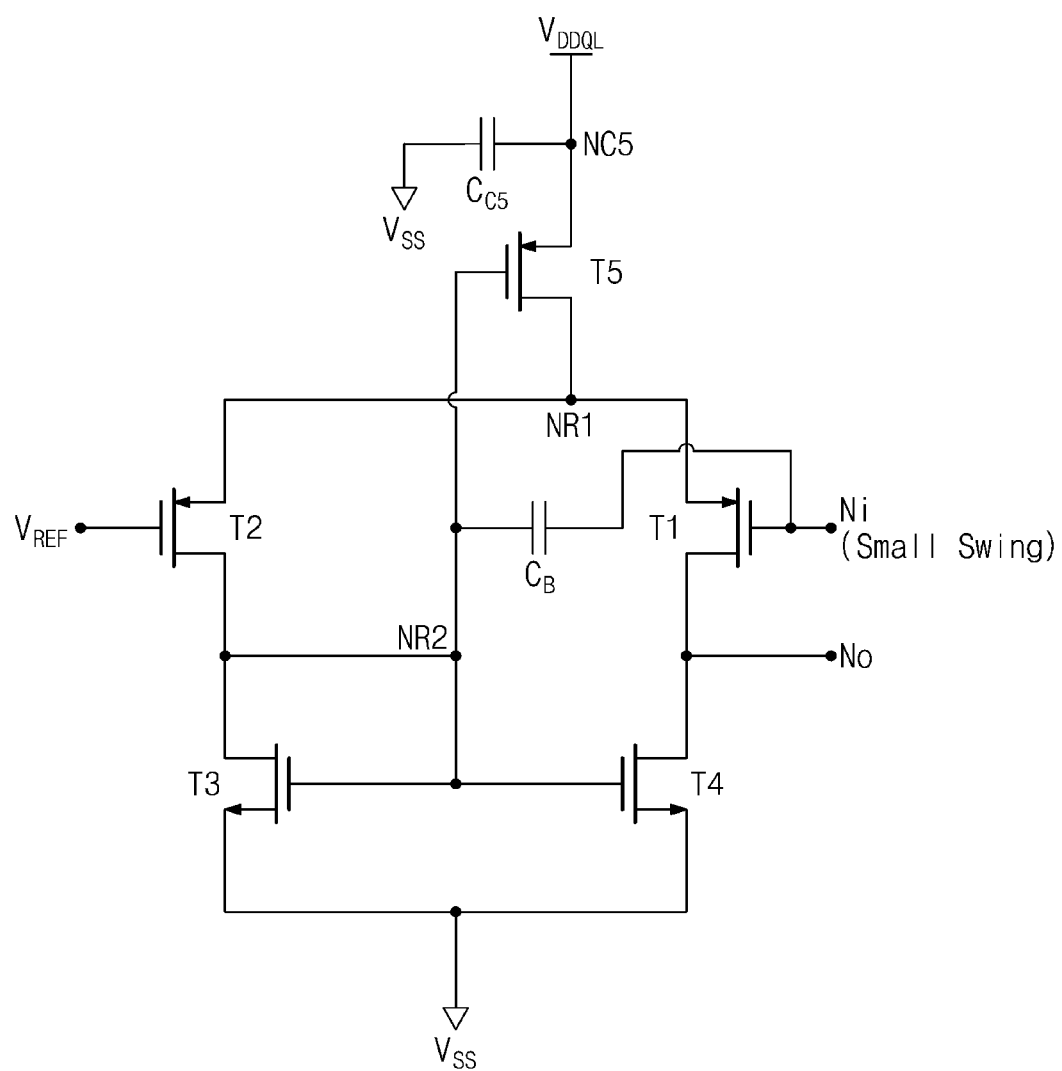
FIG. 5 is a circuit diagram illustrating a receiver of FIG. 1 in detail according to example embodiments.

FIG. 5 is a circuit diagram illustrating the receiver Rx of FIG. 1 in detail according to example embodiments. Referring to FIG. 5, the receiver Rx may be driven based on the power supply voltages $V_{DDQL}$ and $V_{SS}$ and may determine a logical level of a small swing data signal based on a reference voltage $V_{REF}$. The receiver Rx of FIG. 5 may be the receiver Rx of the first driver circuit 112 of FIG. 1 or may be the receiver Rx of the second driver circuit 121 of FIG. 1.

The receiver Rx may include first to fifth transistors T1 to T5 and a boosting capacitor CB. The first transistor T1 may be connected between a first reception node NR1 and an output node No and may operate in response to a voltage of an input node Ni. The input node Ni may receive a small swing data signal. The output node No may be a node at which a voltage of the determined logical level of the small swing data signal is formed.

The second transistor T2 may be connected between the first reception node NR1 and a second reception node NR2 and may operate in response to the reference voltage $V_{REF}$. The reference voltage $V_{REF}$ may be used as a reference for determining a logical level of a small swing data signal. For example, the reference voltage $V_{REF}$ may be 0.2 V.

The third transistor T3 may be connected between the second reception node NR2 and the ground node $V_{SS}$ and may operate in response to a voltage of the second reception node NR2.

The fourth transistor T4 may be connected between the output node No and the ground node $V_{SS}$ and may operate in response to a voltage of the second reception node NR2.

The fifth transistor T5 may be connected between a fifth capacitor node NC5 and the first reception node NR1 and may operate in response to a voltage of the second reception node NR2. The fifth capacitor node NC5 may receive the power supply voltage $V_{DDQL}$. The fifth capacitor node NC5 may be connected to a fifth cell capacitor $C_{C5}$. The fifth cell capacitor $C_{C5}$ may block or reduce a noise introduced to the power supply voltage $V_{DDQL}$. The fifth cell capacitor $C_{C5}$ may be the cell capacitor which is simultaneously formed with capacitors of memory cells if the receiver Rx of FIG. 5 is included in the second driver circuit 121 of FIG. 1, and the fifth cell capacitor $C_{C5}$ may be a typical capacitor which is formed in such as a MOS capacitor if the receiver Rx of FIG. 5 is included in the first driver circuit 112 of FIG. 1.

The boosting capacitor CB may be connected between the input node Ni and the second reception node NR2. In an example embodiment, as the boosting capacitor CB transfers a voltage of the input node Ni to the second reception node NR2, the receiver Rx may determine a logical level of a small swing data signal more accurately and much faster.

Figure 6:
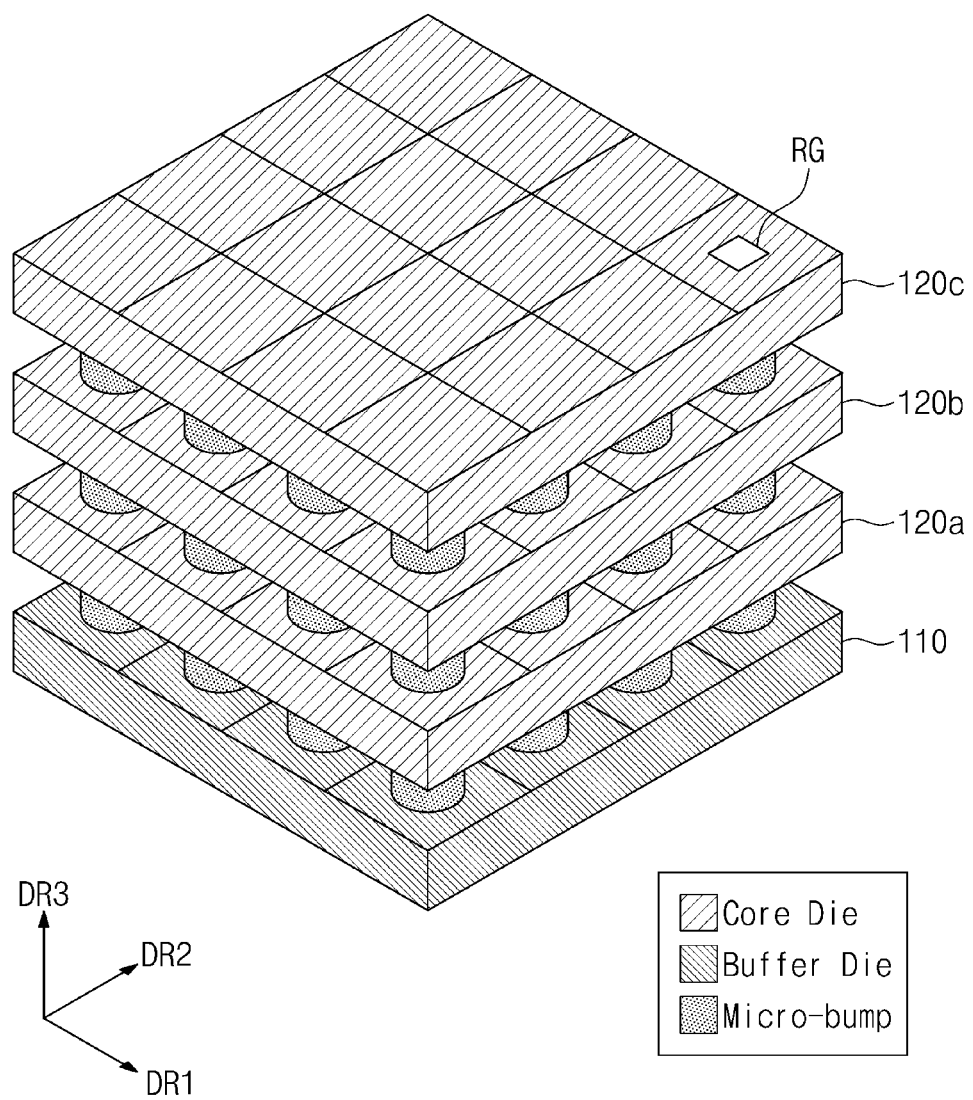
FIG. 6 is a perspective view of a memory device according to an embodiment of the present disclosure.

FIG. 6 is a perspective view of the memory device 100 according to an embodiment of the present disclosure. Referring to FIG. 6, the memory device 100 may include the buffer die 110 and the first to third core dies 120a to 120c sequentially stacked in the third direction DR3. The buffer die 110 may be connected to the first core die 120a through micro-bumps. The first core die 120a may be connected to the second core die 120b through micro-bumps. The second core die 120b may be connected to the third core die 120c through micro-bumps.

Each of the first to third core dies 120a to 120c may include a plurality of core die regions RG. The core die regions RG may include lower regions supplied with power supply voltages through corresponding micro-bumps, lower regions in which micro-bumps do not exist or is incapable of being disposed, and empty lower regions.

In an example embodiment, the buffer die 110 and the first to third core dies 120a to 120c may include a plurality of TSVs that overlap micro-bumps in the third direction DR3 and penetrate the buffer die 110 and the first to third core dies 120a to 120c. The TSVs may be electrically connected to the corresponding micro-bumps.

Figure 7:
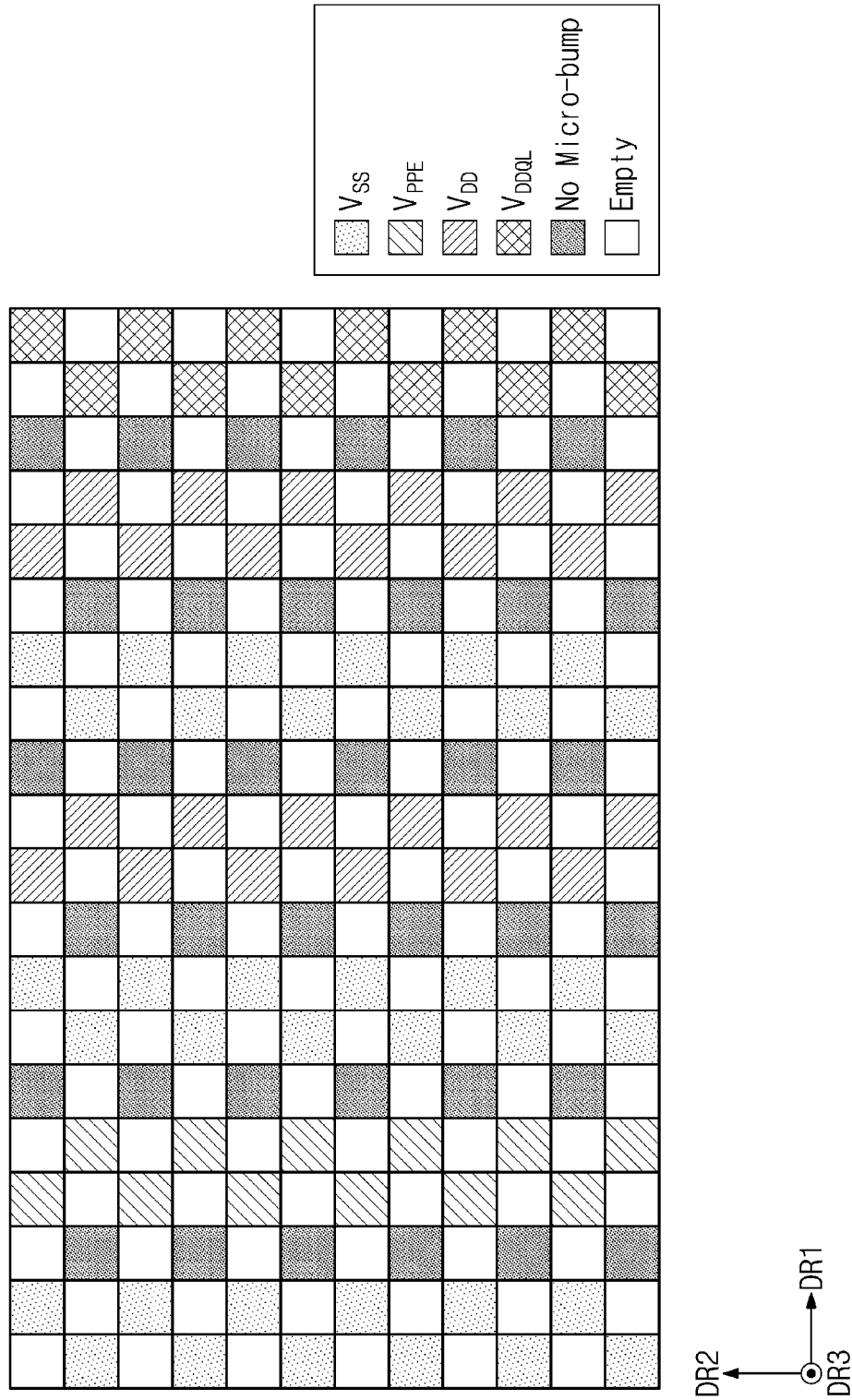
FIG. 7 is a diagram illustrating a core die region of FIG. 6 in detail according to example embodiments.

FIG. 7 is a diagram illustrating the core die region RG of FIG. 6 in detail according to example embodiments. The core die region RG viewed from the third direction DR3 are illustrated in FIG. 7. The core die region RG may include a plurality of lower regions arranged in the first direction DR1 and the second direction DR2. Each lower region may be a region which is supplied with a power supply voltage, in which a micro-bump is incapable of being disposed, or which is empty. The number of lower regions included in the core die region RG, a size of the lower regions, and a shape of the lower regions are illustrated by way of example, but the present disclosure is not limited thereto. The number of lower regions included in the core die region RG and the size of the lower regions may increase or decrease, and the shape of the lower regions may be changed.

A lower region marked by the power supply voltage $V_{SS}$ may be connected to a micro-bump to which the power supply voltage $V_{SS}$ is provided. A lower region marked by the power supply voltage $V_{PPE}$ may be connected to a micro-bump to which the power supply voltage $V_{PPE}$ is provided. A lower region marked by the power supply voltage $V_{DD}$ may be connected to a micro-bump to which the power supply voltage $V_{DD}$ is provided. A lower region marked by the power supply voltage $V_{DDQL}$ may be connected to a micro-bump to which the power supply voltage $V_{DDQL}$ is provided.

A lower region marked by a no micro-bump may be a region in which a micro-bump is not disposed or is incapable of being disposed designing on the design or process of the memory device 100.

A lower region marked by empty may mean an empty region (e.g., no circuit region) of a core die. In an example embodiment, a cell capacitor may be disposed in the lower region marked by empty. The cell capacitor may block or reduce a noise introduced from TSVs that are adjacent in the first direction DR1 or the second direction DR2 and through which a power supply voltage is transmitted.

Figure 8:
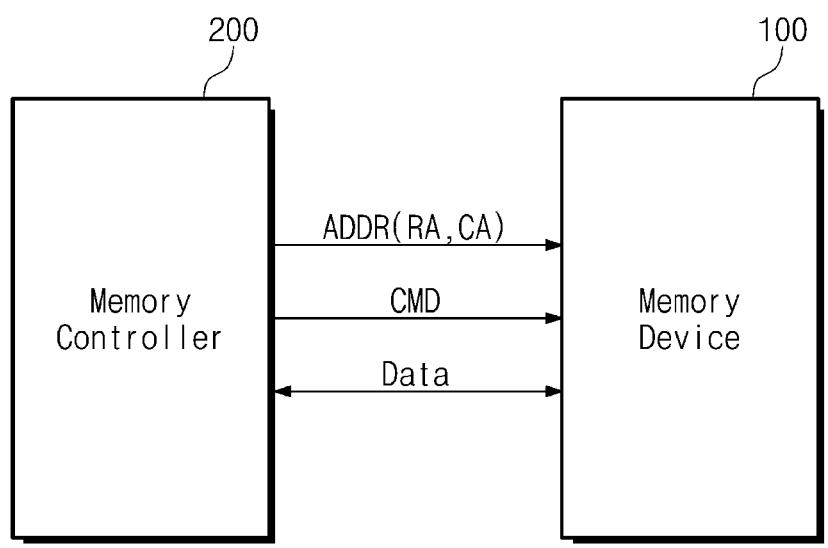
FIG. 8 is a block diagram illustrating a memory system according to an embodiment of the present disclosure.

FIG. 8 is a block diagram illustrating a memory system 1000 according to an embodiment of the present disclosure. Referring to FIG. 8, the memory system 1000 may include a memory device 100 and a memory controller 200. The memory controller 200 may transmit an address ADDR and a command CMD to the memory device 100 for the purpose of storing data in the memory device 100 or reading data stored in the memory device 100.

In an example embodiment, the address ADDR may include a row address RA and a column address CA. The command CMD may include an active command, a write command, a read command, or a precharge command. However, the present disclosure is not limited thereto. For example, the address ADDR may include various types of addresses, and the command CMD may include various types of commands.

Under control of the memory controller 200, the memory device 100 may store data received from the memory controller 200 or may transmit data stored therein to the memory controller 200.

In an example embodiment, the memory device 100 may be a dynamic random access memory (DRAM), and the memory controller 200 and the memory device 100 may communicate with each other based on a double data rate (DDR) interface. However, the present disclosure is not limited thereto. For example, the memory device 100 may be one of various memory devices such as a static random access memory (SRAM), a synchronous DRAM (SDRAM), a magnetic RAM (MRAM), a ferroelectric RAM (FRAM), a resistive RAM (ReRAM), and a phase-change RAM (PRAM), and the memory controller 200 and the memory device 100 may communicate with each other based on one of various interfaces such as low power DDR (LPDDR), universal serial bus (USB), modular multilevel converter (MMC), peripheral component interconnect (PCI), PCI express (PCI-E), advanced technology attachment (ATA), serial ATA (SATA), parallel ATA (PATA), small computer system interface (SCSI), enhanced standard (small/system) device interface (ESDI), and integrated drive electronics (IDE).

The memory device 100 may be a low-power memory device that is driven based on the power supply voltage $V_{DDQL}$ lower than the power supply voltage $V_{DD}$ and stores data based on a small swing data signal of a low voltage. The memory device 100 may be a device that includes memory dies (e.g., a buffer die and a core die) stacked three-dimensionally. The memory device 100 of FIG. 8 may be the memory device 100 of FIG. 1 or the memory device 100 of FIG. 6.

Figure 9:
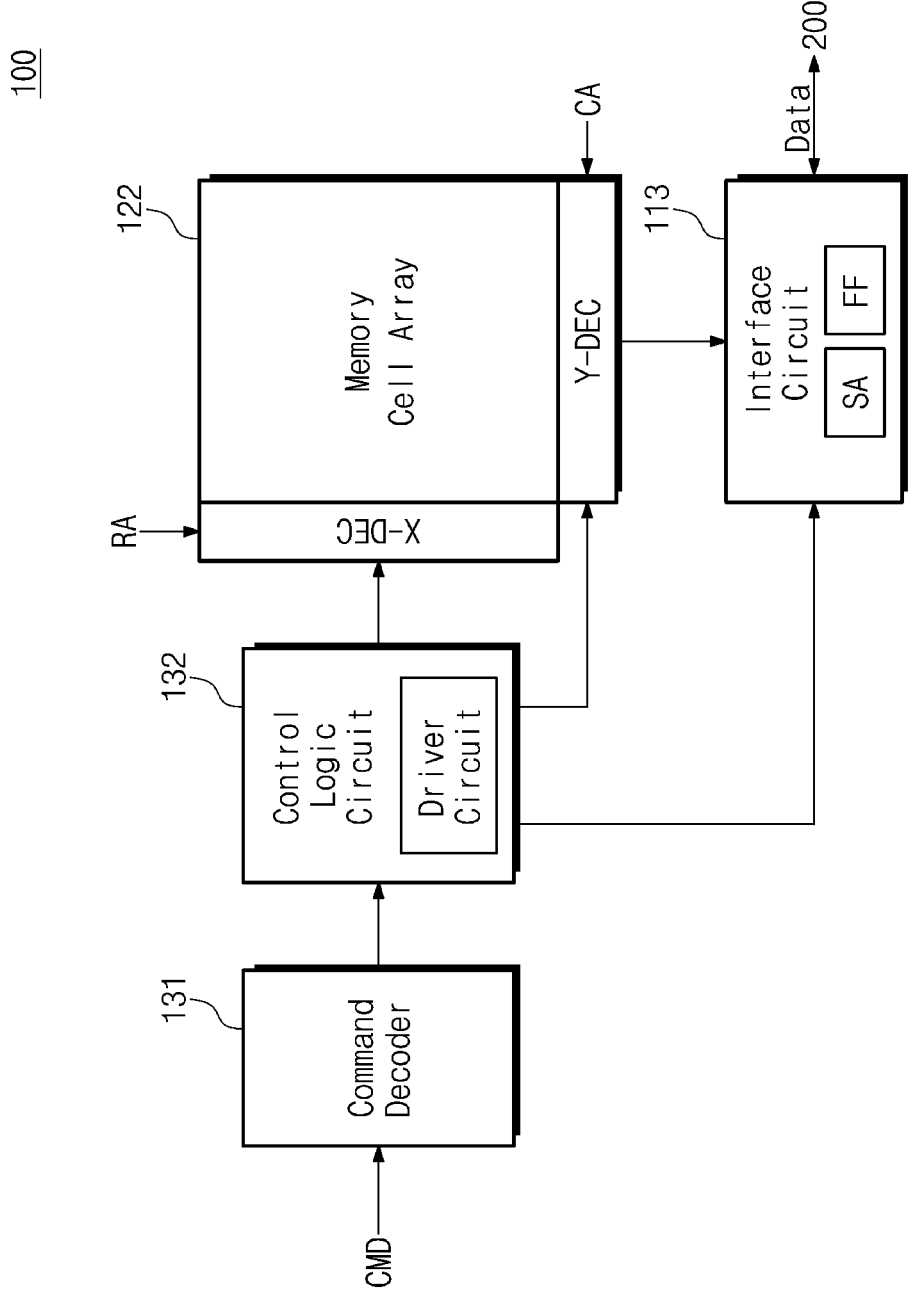
FIG. 9 is a block diagram illustrating a memory device of FIG. 8 in detail according to example embodiments.

FIG. 9 is a block diagram illustrating the memory device 100 of FIG. 8 according to example embodiments. Referring to FIGS. 8 and 9, the memory device 100 may include a command decoder 131, a control logic circuit 132, the memory cell array 122, and the interface circuit 113.

The command decoder 131 may receive the command CMD from the memory controller 200. The command decoder 131 may provide a result of decoding the command CMD to the control logic circuit 132.

The control logic circuit 132 may control components of the memory device 100 based on the decoding result from the command decoder 131. For example, the control logic circuit 132 may control at least a part of an X-decoder X-DEC, a Y-decoder Y-DEC, and the interface circuit 113 such that there is performed an operation, which corresponds to the decoding result of the command decoder 131, such as a read operation or a write operation.

The memory cell array 122 may include a plurality of memory cells. A plurality of memory cells may be connected to word lines and bit lines. The word lines may be connected to the X-decoder X-DEC, and the bit lines may be connected to the Y-decoder Y-DEC.

The interface circuit 113 may exchange data with the memory controller 200. The interface circuit 113 may include the sense amplifier SA and the flip-flop FF. The sense amplifier SA may be a circuit that amplifies an analog signal. The flip-flop FF may be a circuit that holds or stores a data signal.

In an example embodiment, the memory device 100 may be implemented with a buffer die and a core die stacked three-dimensionally. For example, the interface circuit 113 may be included in the buffer die 110 of FIG. 1. The memory cell array 122 may be included in the core die 120 of FIG. 1. At least a part (e.g., a driver circuit) of the control logic circuit 132 may be included in the core die 120 of FIG. 1.

Figure 10:
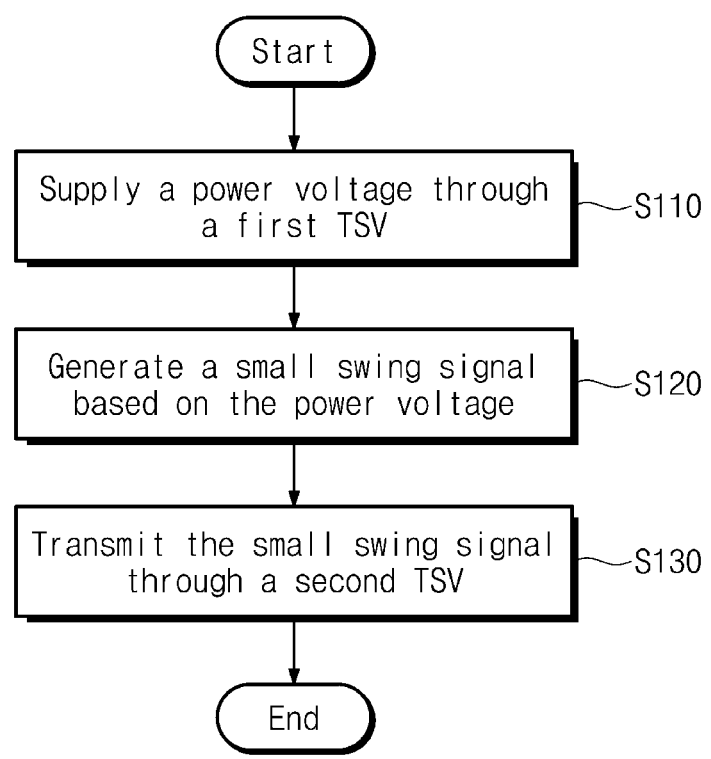
FIG. 10 is a flowchart illustrating an operation method of a memory device according to an embodiment of the present disclosure.

FIG. 10 is a flowchart illustrating an operation method of a memory device according to an embodiment of the present disclosure. A memory device may be the memory device 100 of FIG. 1. Referring to FIGS. 1 and 10, the memory device 100 may include the buffer die 110 and the core die 120 electrically connected to the buffer die 110 through first and second TSVs.

In operation S110, the memory device 100 may supply at least one of the power supply voltages $V_{DD}$, $V_{DDQL}$, and $V_{SS}$ from the power line distributer 111 of the buffer die 110 to the core die 120 through a corresponding TSV. In an example embodiment, at least one noise introduced to at least one of the power supply voltages $V_{DD}$, $V_{DDQL}$, and $V_{SS}$ may be blocked or reduced by the cell capacitor of the core die 120.

In an example embodiment, the core die 120 may be connected to the buffer die 110 through first to fourth TSVs. The first to third TSVs may supply the power supply voltages $V_{DD}$, $V_{DDQL}$, and $V_{SS}$ of the power line distributer 111 to the core die 120, respectively. The fourth TSV may transmit a small swing data signal between the first driver circuit 112 and the second driver circuit 121. The core die 120 may include first to third cell capacitors respectively corresponding to the power supply voltages $V_{DD}$, $V_{DDQL}$, and $V_{SS}$. The first to third cell capacitors may block or reduce first to third noises introduced to the power supply voltages $V_{DD}$, $V_{DDQL}$, and $V_{SS}$.

In operation S120, the memory device 100 may generate a small swing data signal based on the power supply voltage supplied in operation S110. In an example embodiment, the memory device 100 may generate the small swing data signal based on the power supply voltages $V_{DD}$, $V_{DDQL}$, and $V_{SS}$. In operation S130, the memory device 100 may transmit the small swing data signal generated in operation S120 through one or more corresponding TSVs.

In an example embodiment, the memory device 100 may transmit the small swing data signal from the core die 120 to the buffer die 110. For example, in operation S120, the transmitter Tx included in the core die 120 of the memory device 100 may generate the small swing data signal based on the power supply voltages $V_{DD}$, $V_{DDQL}$, and $V_{SS}$. The transmitter Tx of the core die 120 may be driven based on the power supply voltages $V_{DD}$, $V_{DDQL}$, and $V_{SS}$ transmitted through one or more corresponding TSVs in operation S110. In operation S130, the memory device 100 may transmit the small swing data signal from the transmitter Tx of the core die 120 to the receiver Rx of the buffer die 110 through one or more corresponding TSVs.

In an example embodiment, the memory device 100 may transmit the small swing data signal from the buffer die 110 to the core die 120. For example, in operation S120, the transmitter Tx included in the buffer die 110 of the memory device 100 may generate the small swing data signal based on the power supply voltages $V_{DD}$, $V_{DDQL}$, and $V_{SS}$. In operation S130, the memory device 100 may transmit the small swing data signal from the transmitter Tx of the buffer die 110 to the receiver Rx of the core die 120 through one or more corresponding TSVs. The receiver Rx of the core die 120 may be driven based on the power supply voltages $V_{DD}$, $V_{DDQL}$, and $V_{SS}$ transmitted through one or more corresponding TSVs in operation S110.

In an example embodiment, a voltage of the small swing data signal may range from the power supply voltage $V_{SS}$ and the power supply voltage $V_{DDQL}$.

According to the present disclosure, a memory device that is driven with a low power supply voltage and is capable of reducing power consumption by transmitting a small swing data signal of a voltage lower than that of a general data signal, and an operation method thereof are provided.

Also, a memory device in which an influence due to a noise is reduced by blocking any other voltage through a cell capacitor of a core die and the reliability of data stored therein is improved, and an operation method thereof are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A memory device comprising:
a buffer die configured to output a first power supply voltage to a first through-substrate via (TSV) and to receive a first small swing data signal from a second TSV generated based on the first power supply voltage; and a first core die electrically connected to the buffer die through the first and second TSVs, including a first cell capacitor electrically connected to the first TSV and configured to block a first noise introduced to the first power supply voltage received through the first TSV, the first core die configured to output the first small swing data signal to the second TSV, wherein a voltage of a high level of the first small swing data signal is lower than the first power supply voltage.

2. The memory device of claim 1, wherein the buffer die is further configured to:
output a second power supply voltage smaller than the first power supply voltage to a third TSV,
output a third power supply voltage smaller than the second power supply voltage to a fourth TSV, and
receive the first small swing data signal based on the second and third power supply voltages, and
wherein the first core die:
is electrically connected to the buffer die further through the third and fourth TSVs,
includes a second cell capacitor connected to the third TSV and configured to block a second noise introduced to the second power supply voltage received through the third TSV, and
is configured to generate the first small swing data signal based on the first to third power supply voltages.

3. The memory device of claim 2, wherein the first core die includes a transmitter configured to be driven based on the first to third power supply voltages and to generate the first small swing data signal, and
wherein the transmitter includes:
a multiplexer configured to generate a pull-up signal and a pull-down signal based on a first data signal, a second data signal corresponding to an inverted version of the first data signal, a clock signal, the first power supply voltage, and the third power supply voltage;
a first transistor connected between a first node configured to receive the second power supply voltage and a second node configured to output the first small swing data signal, and configured to operate in response to the pull-up signal; and
a second transistor connected between the second node and a third node configured to receive the third power supply voltage, and configured to operate in response to the pull-down signal.

4. The memory device of claim 3, wherein the first and second transistors are NMOS transistors.

5. The memory device of claim 2, further comprising:
a voltage regulator configured to provide the second power supply voltage to the buffer die,
wherein the first core die includes a transmitter driven based on the first to third power supply voltages and configured to generate the first small swing data signal, and
wherein the transmitter includes:
a comparator configured to compare the second power supply voltage and a voltage of a first node and output a comparison signal;
a first transistor connected between a second node configured to receive the first power supply voltage and the first node, the first transistor configured to operate in response to the comparison signal;
a second transistor connected between the first node and a third node configured to output the first small swing data signal, the second transistor configured to operate in response to a first data signal; and a third transistor connected between the third node and a fourth node configured to receive the third power supply voltage, the third transistor configured to operate in response to a second data signal corresponding to an inverted version of the first data signal.

6. The memory device of claim 2, wherein the buffer die includes a receiver driven based on the second and third power supply voltages and configured to determine a logical level of the first small swing data signal, and wherein the receiver includes:
a first transistor connected between a first node and an output node at which a voltage of the determined logical level is formed and configured to operate in response to a voltage of an input node configured to receive the first small swing data signal;
a second transistor connected between the first node and a second node and configured to operate in response to a reference voltage used as a reference for determining the logical level;
a third transistor connected between the second node and a third node configured to receive the third power supply voltage, and configured to operate in response to a voltage of the second node;
a fourth transistor connected between the output node and the third node and configured to operate in response to the voltage of the second node;
a fifth transistor connected between a fourth node configured to receive the second power supply voltage and the first node and configured to operate in response to the voltage of the second node; and
a boosting capacitor connected between the input node and the second node.

7. The memory device of claim 2, wherein a voltage of the first small swing data signal ranges from the second power supply voltage to the third power supply voltage.

8. The memory device of claim 1, wherein the first core die includes a memory cell array including a plurality of memory cells,
wherein each memory cell of the plurality of memory cells includes a transistor, and a capacitor connected to the transistor and configured to store data, and
wherein the first cell capacitor and the capacitor of memory cell are at the same height.

9. The memory device of claim 1, wherein the buffer die and the first core die are from different wafers.

10. The memory device of claim 1, further comprising:
a second core die disposed in parallel with the buffer die and the first core die and configured to receive the first power supply voltage through a first feed line including the first TSV and to transmit or receive the first small swing data signal through a second feed line including the second TSV,
wherein the first feed line includes a first micro-bump interposed between the buffer die and the first core die and a second micro-bump interposed between the first core die and the second core die, and
wherein the second feed line includes a third micro-bump interposed between the buffer die and the first core die and a fourth micro-bump interposed between the first core die and the second core die.

11. The memory device of claim 1, wherein the buffer die includes:
a power line distributer configured to output the first power supply voltage to the first TSV;
a first driver circuit driven based on the first power supply voltage and including a receiver configured to receive the first small swing data signal from the second TSV and a transmitter configured to output a second small swing data signal to the second TSV; and
an interface circuit electrically connected to the first driver circuit and including a flip-flop configured to hold the first small swing data signal and a sense amplifier configured to amplify the first small swing data signal.

12. The memory device of claim 1, wherein the first core die includes:
a second driver circuit driven based on the first power supply voltage and including a transmitter configured to output the first small swing data signal to the second TSV and a receiver configured to receive a second small swing data signal from the second TSV; and
a memory cell array configured to store data corresponding to the first small swing data signal and data corresponding to the second small swing data signal.

13. A memory device comprising:
a buffer die configured to output a first power supply voltage to a first through-substrate via (TSV) and to output a small swing data signal to a second TSV generated based on the first power supply voltage; and
a core die electrically connected to the buffer die through the first and second TSVs, including a first cell capacitor electrically connected to the first TSV and configured to block a first noise introduced to the first power supply voltage received through the first TSV, the core die configured to receive the small swing data signal from the second TSV,
wherein a voltage of a high level of the small swing data signal is lower than the first power supply voltage.

14. The memory device of claim 13, wherein the buffer die is further configured to:
output a second power supply voltage smaller than the first power supply voltage to a third TSV,
output a third power supply voltage smaller than the second power supply voltage to a fourth TSV, and
generate the small swing data signal based on the first to third power supply voltages,
wherein the core die:
is electrically connected to the buffer die further through the third and fourth TSVs,
includes a second cell capacitor connected to the third TSV and configured to block a second noise introduced to the second power supply voltage received through the third TSV, and
is further configured to receive the small swing data signal based on the second and third power supply voltages.

15. The memory device of claim 14, wherein the buffer die includes a transmitter driven based on the first to third power supply voltages and configured to generate the small swing data signal, and
wherein the transmitter includes:
a multiplexer configured to generate a pull-up signal and a pull-down signal based on a first data signal, a second data signal corresponding to an inverted version of the first data signal, a clock signal, the first power supply voltage, and the third power supply voltage;
a first transistor connected between a first node configured to receive the second power supply voltage and a second node configured to output the small swing data signal and the first transistor configured to operate in response to the pull-up signal; and
a second transistor connected between the second node and a third node configured to receive the third power supply voltage and the second transistor configured to operate in response to the pull-down signal.

16. The memory device of claim 14, wherein the buffer die includes a transmitter driven based on the first to third power supply voltages and configured to generate the small swing data signal, and wherein the transmitter includes:
- a comparator configured to compare the second power supply voltage and a voltage of a first node and output a comparison signal;
- a first transistor connected between a second node configured to receive the first power supply voltage and the first node and the first transistor configured to operate in response to the comparison signal;
- a second transistor connected between the first node and a third node configured to output the small swing data signal and the second transistor configured to operate in response to a first data signal; and
- a third transistor connected between the third node and a fourth node configured to receive the third power supply voltage and the third transistor configured to operate in response to a second data signal corresponding to an inverted version of the first data signal.

17. The memory device of claim 14, wherein the core die includes a receiver driven based on the second and third power supply voltages and configured to determine a logical level of the small swing data signal, and wherein the receiver includes:
- a first transistor connected between a first node and an output node at which a voltage of the determined logical level is formed and configured to operate in response to a voltage of an input node configured to receive the small swing data signal;
- a second transistor connected between the first node and a second node and configured to operate in response to a reference voltage used as a reference for determining the logical level;
- a third transistor connected between the second node and a third node configured to receive the third power supply voltage and configured to operate in response to a voltage of the second node;
- a fourth transistor connected between the output node and the third node and configured to operate in response to the voltage of the second node;
- a fifth transistor connected between a fourth node configured to receive the second power supply voltage and the first node and configured to operate in response to the voltage of the second node; and
- a boosting capacitor connected between the input node and the second node.

18. An operation method of a memory device which includes a buffer die and a core die electrically connected to the buffer die through a first through-substrate via (TSV) and a second TSV, the method comprising:
- supplying a first power supply voltage from the buffer die to the core die through the first TSV;
- blocking or reducing a first noise introduced to the first power supply voltage by a first cell capacitor of the core die, the first cell capacitor electrically connected to the first TSV;
- generating, at the buffer die or the core die, a small swing data signal based on the first power supply voltage; and
- transmitting the small swing data signal through the second TSV.

19. The method of claim 18, wherein the core die is further electrically connected to the buffer die through a third TSV and a fourth TSV, and the method further comprising:
- supplying a second power supply voltage smaller than the first power supply voltage from the buffer die to the core die through the third TSV;
- blocking or reducing a second noise introduced to the second power supply voltage by a second cell capacitor of the core die, the second cell capacitor electrically connected to the third TSV; and
- supplying a third power supply voltage smaller than the second power supply voltage from the buffer die to the core die through the fourth TSV.

20. The method of claim 19, wherein the generating of the small swing data signal based on the first power supply voltage at the buffer die or the core die includes:
- generating, at the buffer die or the core die, the small swing data signal based on the first to third power supply voltages, and wherein a voltage of the small swing data signal ranges from the second power supply voltage to the third power supply voltage.

* * * * *